United States Patent [19]
Ogita

[11] 4,128,810
[45] Dec. 5, 1978

[54] SIGNAL LEVEL INDICATOR DRIVING CIRCUIT

[75] Inventor: Minoru Ogita, Hamamatsu, Japan

[73] Assignee: Nippon Gakki Seizo Kabushiki Kaisha, Hamamatsu, Japan

[21] Appl. No.: 717,391

[22] Filed: Aug. 24, 1976

[30] Foreign Application Priority Data

Aug. 28, 1975 [JP] Japan .............................. 50-103430

[51] Int. Cl.² .............................................. H04B 1/26
[52] U.S. Cl. ..................................... 325/398; 325/455
[58] Field of Search ................. 325/398, 455, 319, 364

[56] References Cited

U.S. PATENT DOCUMENTS

| | | | |
|---|---|---|---|
| 2,223,188 | 11/1940 | Shofstall | 325/492 |
| 2,228,858 | 1/1941 | Tellegen et al. | 325/398 |
| 2,259,121 | 10/1941 | Temple | 325/492 |
| 2,836,713 | 5/1958 | Scott et al. | 325/398 |
| 3,319,004 | 5/1967 | Avins | 325/455 |
| 3,365,669 | 1/1968 | Funaki et al. | 325/364 |
| 3,525,045 | 8/1970 | Von Recklinghausen | 325/398 |

*Primary Examiner*—Robert L. Griffin
*Assistant Examiner*—Marc E. Bookbinder
*Attorney, Agent, or Firm*—Cushman, Darby & Cushman

[57] ABSTRACT

In a radio receiver circuit provided with an automatic gain control circuit, a tuning indicator driving circuit is connected to a point in the signal transmission line of the receiver circuit at which the ac voltage level is zero and the dc voltage level is controlled by the output of the automatic gain control circuit. The change of the dc voltage level is utilized to indicate the input signal level in an indicator.

4 Claims, 10 Drawing Figures

SIGNAL LEVEL INDICATOR DRIVING CIRCUIT

BACKGROUND OF THE INVENTION a. Field of the Invention

This invention relates to a driver circuit for an indicator of an ac signal level, and more particularly to an indicator driving circuit for driving an indicator of a high frequency signal level such as a meter for use of tuning indication in a radio receiver circuit.

b. Description of the Prior Art

In a radio receiver circuit for FM and/or AM broadcasting, a tuning indicator is often used for indicating the level of the received signal. Various types of such indicators have been proposed. Generally, a received high frequency (HF) signal or the intermediate frequency (IF) signal formed by frequency-converting the HF signal is detected and rectified for driving the indicator such as a meter. When the driving energy is not large enough, the signal may be amplified or an indicator of very high sensitivity has been used.

The former method of utilizing the HF signal, however, is accompanied by the disadvantage that the characteristics of the receiver are affected due to the waveform distortion by the detection, sensitivity drop, output level lowering, beats by the harmonic generated in detection, etc. since the HF signal is treated. Thus, the utilization of the HF signal is undesirable from the practical point of view. Further, since additional circuits such as a detecting circuit and an amplifier for the tuning indication are connected in the HF signal line according to the above method, the total circuit structure will be complicated to raise the manufacturing cost and also to introduce some deterioration factors of lowering the performance.

On the other hand, the latter method of utilizing the IF signal was also accompanied by the following drawback. Namely, the AM receiver circuit is usually provided with an automatic gain control (AGC) circuit for lowering the gain when an intense signal is received and for raising the gain when a weak signal is received so as to hold the output at a constant level. This AGC circuit has a certain time constant and cannot follow very rapid changes of the level of the received signal. Therefore, when the tuning dial is manipulated, the receiver circuit may momentarily receive a very intense signal with the AGC circuit set at the maximum gain. This will cause the over-driving or overshooting of the indicator meter. Namely, the meter indicates a high level momentarily and then becomes stable at a lower level. This is apparently not preferable indication. For preventing such over-driving, a special time constant circuit, etc. should be provided in the driver of the meter. Then, the circuit structure becomes complicated and the manufacturing cost increases.

This invention is made based on the consideration of the above problems and intended to solve the over-driving of the meter by a simple circuit.

SUMMARY OF THE INVENTION

An object of this invention is to provide a tuning indicator driving circuit for use in a radio receiver including a detection circuit for tuning indication which gives no effect to the main signal line, and being capable of preventing the over-driving of an indication meter by a simple circuit structure and also being free from the effect of the time constant of the AGC circuit.

For achieving such objects, the changes in the reverse bias (dc component) from the AGC circuit is detected and the detected changes in the dc component is utilized to drive the tuning indicator.

Other objects, features and advantages of this invention will become apparent in the following description of the preferred embodiments in conjunction with the accompanying drawings.

DETAILED DESCRIPTION OF THE PREFERRED EMBODIMENTS

Figure 1:
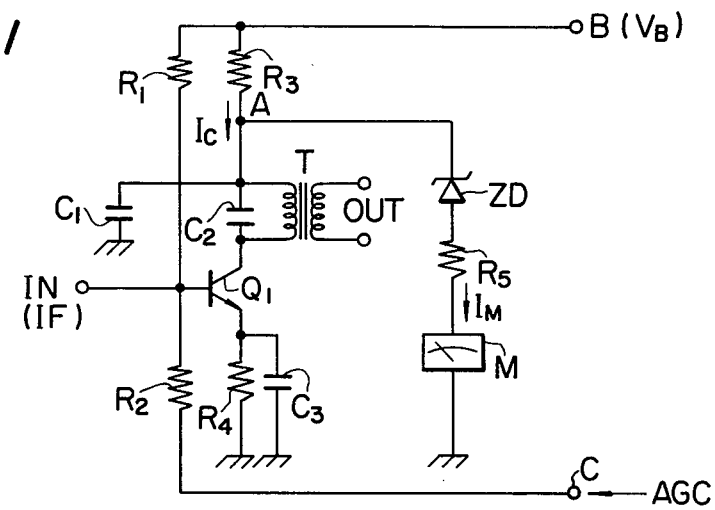
FIG. 1 is a circuit diagram of a tuning indicator driving circuit according to an embodiment of this invention.

FIG. 1 shows a tuning indicator driving circuit in which the inventive circuit is attached to an IF amplifier stage. In the figure, terminals IN, B and C receive the IF signal, B- voltage $V_B$ and the output signal of the AGC circuit, respectively. Terminals OUT supplies the amplified IF signal to the next IF amplifier stage. An npn transistor $Q_1$ has a base connected to the input terminal IN, a collector connected to the parallel connection of a capacitor $C_2$ and the primary winding of a transformer T, and an emitter connected to the ground through the parallel connection of a resistor $R_4$ and a capacitor $C_3$. A voltage-dividing circuit consisting of resistors $R_1$ and $R_2$ is connected between the terminals B and C at the two ends and to the gate of the transistor $Q_1$ at the intermediate point for supplying the base bias voltage to the transistor $Q_1$. The other end (point A) of the primary winding of the transformer T is connected to the power source terminal B through a resistor $R_3$ and to the ground through a capacitor $C_1$, while the secondary winding of the transformer T is connected to the output terminals OUT. Here, the resistor $R_3$ and the capacitor $C_1$ form a time constant circuit. A meter M is a tuning indicator and has one end connected to the point A (interconnection of the resistor $R_3$, the transformer T and the capacitors $C_1$ and $C_2$) through a resistor $R_5$ and a Zener diode ZD in series and the other end grounded. The operation point of the transistor $Q_1$ is so set as to constitute a forward AGC amplifier.

Figure 2:
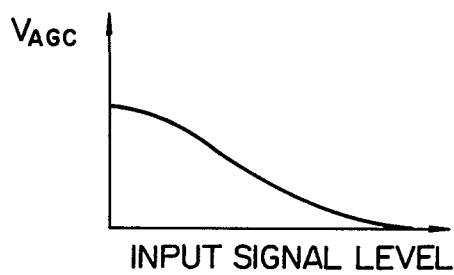
FIGS. 2 to 4 are graphs for illustrating the operation of the circuit of FIG. 1.
Figure 3:
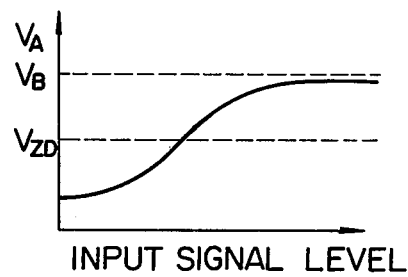
Figure 4:
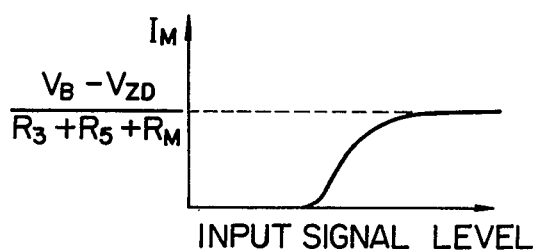

The operation of the above circuit will be described by referring to FIGS. 2 to 4. FIG. 2 shows the change in the voltage $V_{AGC}$ of the AGC signal with respect to the input signal level. FIG. 3 shows the change in the voltage $V_A$ at point A with respect to the input signal level, and FIG. 4 shows the change in the current $I_M$ flowing through the meter M with respect to the input signal level.

The IF signal applied to the input terminal IN is amplified in the transistor $Q_1$ and derived from the output terminal OUT through the transformer T.

The intensity of the IF signal applied to the input terminal IN is displayed in the indicator meter M according to the following operation. The AGC signal changes its voltage $V_{AGC}$ in response to the input signal level as shown in FIG. 2. Namely, when the input signal level is low, the voltage $V_{AGC}$ is high and hence the base voltage of the transistor $Q_1$ is high. Thus, a base current is allowed to flow and the collector-emitter is turned on in the transistor $Q_1$. Here, the dc component of the collector current $I_C$ is large and the voltage $V_A$ at the point A is low as shown in FIG. 3. Therefore, the Zener diode ZD is turned off and the meter current $I_M$ is zero as shown in FIG. 4. When the input signal level becomes high, the AGC voltage $V_{AGC}$ becomes low as shown in FIG. 2, thereby the collector current $I_C$ of the transistor $Q_1$ decreases and the voltage $V_A$ at point A increases as shown in FIG. 3. When the voltage $V_A$ reaches the Zener voltage $V_{ZD}$ of the Zener diode ZD, the Zener diode becomes turned on and a current $I_M$ begins to flow through the meter M as shown in FIG. 4. This meter current increases with the increase in the input signal level. At the maximum input level, the meter current $I_M$ is represented by $$I_M = (V_B - V_{ZD}) / (R_3 + R_5 + R_M)$$

where $R_M$ is the internal resistance of the meter M.

Here, since the point A is grounded through the HF shunting capacitor $C_1$, it is held at the ground potential for the ac signal. Therefore, the tuning indicator driving circuit gives no affects to the ac signal line. Further, the response of the indicator needle of the meter M can be arbitrarily selected by adjusting the time constant determined by the resistance $R_3$ and the capacitance $C_1$. Thus, the over-driving of the indicator which has been the problem can be solved.

In short, the input signal level can be displayed stably by a very simple circuit structure including a Zener diode ZD, a meter M and if necessary a resistance $R_5$ connected in series to a ground potential with respect to the ac component in the IF amplifier stage.

Figure 5:
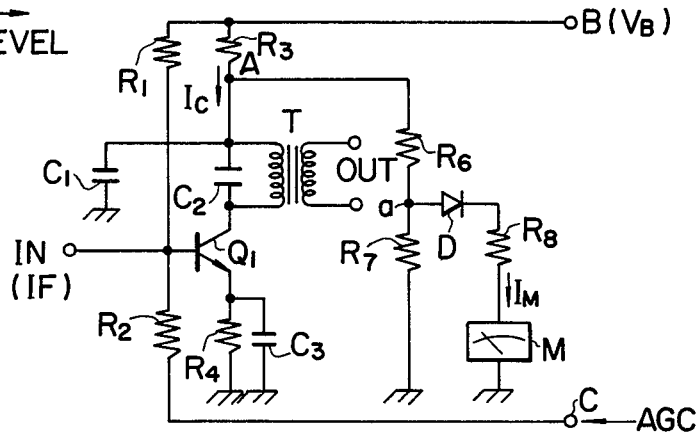
FIG. 5 is a circuit diagram of a tuning indicator driving circuit according to another embodiment of this invention.

FIG. 5 shows another embodiment of a tuning indicator driving circuit, in which the threshold voltage of a diode D is utilized in place of the Zener diode ZD in the circuit of FIG. 1. Similar reference numerals as those of FIG. 1 indicate similar parts. The dc voltage at point A is divided by a voltage dividing circuit consisting of resistors $R_6$ and $R_7$ connected in series. The divided voltage at the interconnection point $a$ is supplied to the anode of a silicon diode D the cathode of which is connected to the ground through a resistor $R_8$ and the meter M.

Figure 6A:
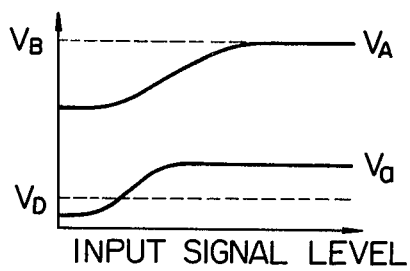
FIGS. 6a and 6b are graphs for illustrating the operation of this circuit of FIG. 5.
Figure 6B:
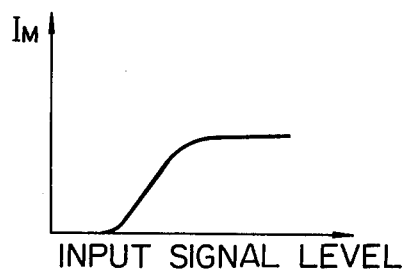

The operation of the circuit of FIG. 5 will be described by referring to FIGS. 6a and 6b. When the input signal level is low, the voltage $V_{AGC}$ of the AGC signal is high and hence the base potential of the transistor $Q_1$ is high. Thus, the dc collector current $I_C$ of the transistor $Q_1$ is large. Therefore, the voltage $V_A$ and $V_a$ at points A and $a$ (interconnection of $R_6$ and $R_7$) are low as shown in FIG. 6a. Then, the silicon diode D is cut off and the meter current $I_M$ through the meter M is zero as shown in FIG. 6b. When the input signal level becomes high, the voltage $V_{AGC}$ from the AGC circuit decreases and the collector current $I_C$ of the transistor $Q_1$ decreases. Along with the decrease in the collector current $I_C$, the potential $V_A$ at point A and hence the potential $V_a$ at point $a$ increases. When the potential $V_a$ reaches the threshold voltage $V_d$ of the silicon diode D ($V_D \approx 0.6V$), the silicon diode D becomes turned-on and a meter current $I_M$ through the meter M begins to flow as shown in FIG. 6b and increases with the increase of the input signal level. In this way, the intensity of the input signal can be indicated in the meter M.

Figure 7:
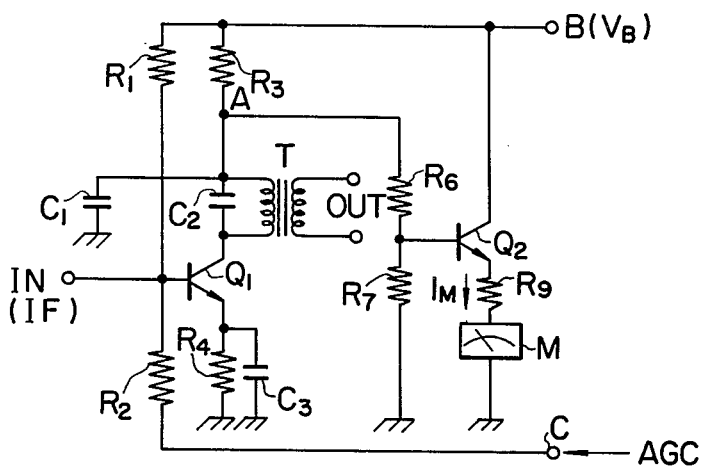
FIGS. 7, 8 and 9 are circuit diagrams of tuning indicator driving circuits according to other embodiments of this invention.
Figure 8:
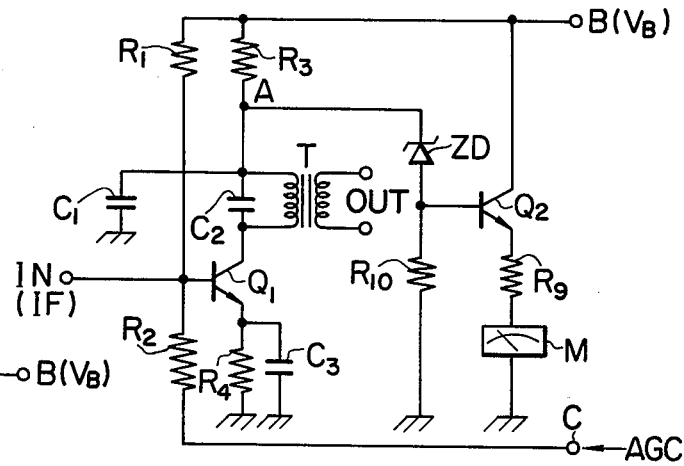

FIGS. 7 and 8 show other embodiments, in which the rise of the base-emitter voltage $V_{BE}$ of a second transistor is utilized for expanding the sensitivity region of the meter M. In the figures, similar letters and numerals indicate similar parts as those of FIGS. 1 and 5. In the circuit of FIG. 7, a second transistor Q2 has a collector connected to the power source terminal B, an emitter grounded through a series connection of a resistor $R_9$ and a meter M, and a base connected to the interconnection point of the resistors $R_6$ and $R_7$. Namely, the diode D of the circuit of FIG. 5 is replaced by the second transistor $Q_2$ in the circuit of FIG. 7 and the threshold voltage of the transistor $Q_2$ is utilized.

In the circuit of FIG. 7, when the input signal level is low, the base potential of the transistor $Q_2$ is low and the transistor $Q_2$ is in the cut-off state. Hence, no current is allowed to flow through the meter M. When the input signal level increases, the potential at point A increases and the base potential of the second transistor $Q_2$ becomes to have positive polarity with respect to the emitter voltage. Then, the transistor $Q_2$ is turned on and a current $I_M$ begins to flow through the meter M. The meter current $I_M$ increases with the increase of the input signal level.

In the embodiment of FIG. 8, the voltage dividing circuit for the second transistor $Q_2$ is formed of a Zener diode ZD and a resistor $R_{10}$ in place of the resistors $R_6$ and $R_7$ of the circuit of FIG. 7. Namely, the cathode of the Zener diode ZD is connected to point A and the anode thereof is connected to the ground through the resistor $R_{10}$. When the input signal level is low, the Zener diode ZD is in the cut-off state and the current $I_M$ through the meter M is zero. When the input signal level increases, the potential $V_A$ at point A increases. When the potential $V_A$ reaches the Zener voltage of the Zener diode ZD, this Zener diode becomes conductive and the voltage $V_A$ is applied to the base of the transistor $Q_2$. Then, a base current is allowed to flow in the transistor $Q_2$ and the transistor $Q_2$ becomes conductive. Thus, the meter current $I_M$ begins to flow through the meter M and increases with the increase of the input signal level. Thus, the intensity of the input signal is indicated in the meter.

Figure 9:
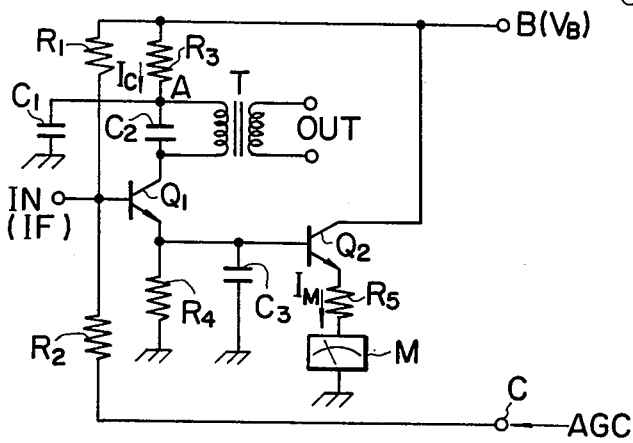

In the above embodiments, the tuning indicator circuit is connected to the collector side of the IF amplifying transistor $Q_1$, but it can similarly be connected to the emitter side as shown in FIG. 9. In this embodiment the operation point of the transistor $Q_1$ is so set as to constitute a reverse AGC amplifier, and the dc emitter voltage of the transistor $Q_1$ is applied to the base of the second transistor $Q_2$. The emitter of the transistor $Q_1$ is grounded in the ac sense and corresponds to the point A of the foregoing embodiments. It will be apparent that the operation of this circuit is almost similar to that of FIG. 7, except that the AGC voltage increases as the input signal level increases.

Description has been made on the case of connecting a tuning indicator circuit to the IF amplifier stage, but this invention is not limited to such cases and can be also applied to the HF amplifier stage.

As is apparent from the foregoing description, according to this invention, there is provided a tuning indicator driving circuit consisting of a simple circuit structure without using a complicated means, giving no influence to the main signal transmitting line and being free from the influence of the time constant of the AGC circuit. Thus, this invention is very effective in practical use. Further, according to this invention, bad influence to the other circuits and the over-driving of the indicator meter can be prevented as well as the manufacturing cost can be reduced due to the simplified structure.

I claim:

1. A tuning indicator driving circuit for use in a radio receiver circuit including an automatic gain control circuit, comprising:

detector means for detecting a dc component of an output of the automatic gain control circuit, said detector means including a signal amplifying element in the receiver circuit generating an output signal containing said dc component and an ac component, said dc component being controlled by the output of the automatic gain control circuit, means for shunting said ac component of said amplifying element output to ground, and a dc current path means connected to said amplifying element output for transmitting the dc component of said output, said dc current path means comprising means for determining a threshold voltage above which a current is allowed to flow therethrough, said voltage determining means including means for shifting the level of said dc component in said current path means and an element having a threshold voltage connected to said level shifting means; and a tuning indicator means driven by the output of said threshold voltage determining means.

2. A tuning indicator driving circuit according to claim 1, in which said threshold voltage element is a silicon diode.

3. A tuning indicator driving circuit according to claim 1, in which said threshold voltage element is a transistor having a base connected to said level shifting means, an emitter connected to said indicator means and a collector connected to a voltage source.

4. A tuning indicator driving circuit according to claim 3, in which said level shifting means includes a series connection of a Zener diode and a resistance.

* * * * *